(12) United States Patent
Kudoh

(10) Patent No.: US 10,741,604 B2
(45) Date of Patent: Aug. 11, 2020

(54) SEMICONDUCTOR INTEGRATED CIRCUIT, ELECTRONIC DEVICE, SOLID-STATE IMAGING APPARATUS, AND IMAGING APPARATUS

(71) Applicant: Sony Corporation, Tokyo (JP)

(72) Inventor: Yoshiharu Kudoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/161,345

(22) Filed: Oct. 16, 2018

(65) Prior Publication Data

US 2019/0051692 A1  Feb. 14, 2019

Related U.S. Application Data

(63) Continuation of application No. 15/587,165, filed on May 4, 2017, now Pat. No. 10,269,856, which is a
(Continued)

(30) Foreign Application Priority Data

Sep. 3, 2010 (JP) .................................. 2010-197730

(51) Int. Cl.
 *H01L 27/146* (2006.01)
 *H04N 5/376* (2011.01)
 *H04N 5/378* (2011.01)

(52) U.S. Cl.
 CPC .. *H01L 27/14643* (2013.01); *H01L 27/14609* (2013.01); *H01L 27/14612* (2013.01);
(Continued)

(58) Field of Classification Search
 None
 See application file for complete search history.

(56) References Cited

U.S. PATENT DOCUMENTS

| | | | |
|---|---|---|---|
| 2006/0023109 A1* | 2/2006 | Mabuchi | ................. H01L 24/17 348/340 |
| 2008/0042046 A1 | 2/2008 | Mabuchi | |
| 2013/0175652 A1* | 7/2013 | Yamazaki | ......... H01L 27/14607 257/435 |

FOREIGN PATENT DOCUMENTS

| | | |
|---|---|---|
| EP | 1168450 | 1/2002 |
| JP | 2009-170448 | 7/2009 |

(Continued)

OTHER PUBLICATIONS

Extended European Search Report for European Patent Application No. 18199508.5, dated Mar. 27, 2019, 8 pages.
(Continued)

*Primary Examiner* — Cory W Eskridge
(74) *Attorney, Agent, or Firm* — Sheridan Ross P.C.

(57) ABSTRACT

A semiconductor integrated circuit includes a first semiconductor substrate in which a part of an analog circuit is formed between the analog circuit and a digital circuit which subjects an analog output signal output from the analog circuit to digital conversion; a second semiconductor substrate in which the remaining part of the analog circuit and the digital circuit are formed; and a substrate connection portion which connects the first and second semiconductor substrates to each other. The substrate connection portion transmits an analog signal which is generated by a part of the analog circuit of the first semiconductor substrate to the second semiconductor substrate.

20 Claims, 12 Drawing Sheets

Related U.S. Application Data continuation of application No. 15/487,301, filed on Apr. 13, 2017, now Pat. No. 10,396,118, which is a continuation of application No. 15/084,792, filed on Mar. 30, 2016, now Pat. No. 9,627,432, which is a continuation of application No. 14/638,790, filed on Mar. 4, 2015, now Pat. No. 9,691,806, which is a continuation of application No. 13/218,933, filed on Aug. 26, 2011, now Pat. No. 9,000,501.

(52) U.S. Cl.
CPC .. *H01L 27/14623* (2013.01); *H01L 27/14634* (2013.01); *H01L 27/14636* (2013.01); *H04N 5/378* (2013.01); *H04N 5/3765* (2013.01); *H01L 2224/16225* (2013.01); *H01L 2224/32225* (2013.01); *H01L 2224/73204* (2013.01)

(56) References Cited

FOREIGN PATENT DOCUMENTS

| | | |
|---|---|---|
| KR | 10-0801181 | 2/2008 |
| WO | WO 2007/105478 | 9/2007 |

OTHER PUBLICATIONS

Official Action (with English translation) for Korean Patent Application No. 10-2017-0149326, dated Aug. 9, 2018, 5 pages.
Extended European Search Report for European Patent Application No. 19174185.9, dated Jul. 31, 2019, 5 pages.

\* cited by examiner

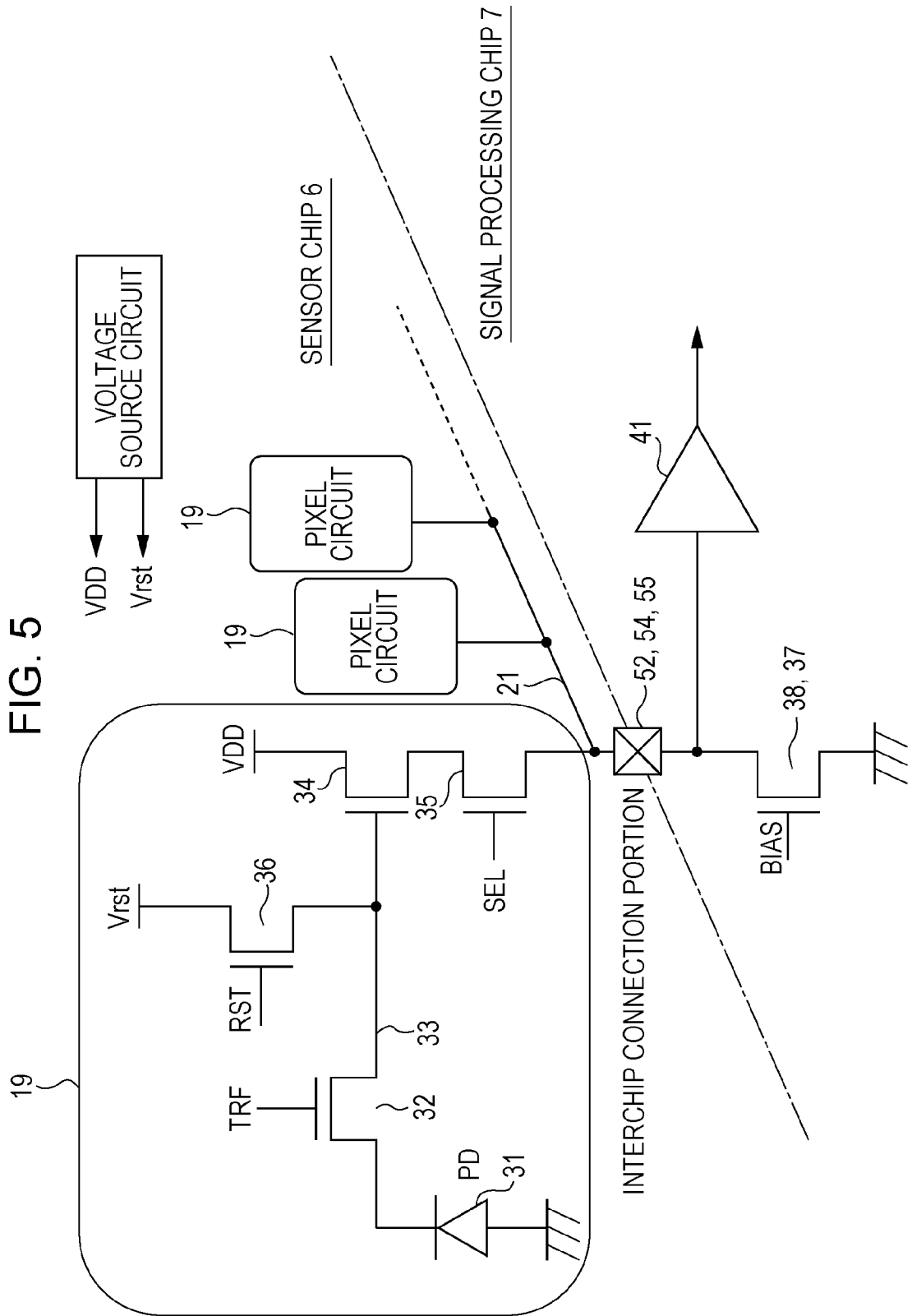

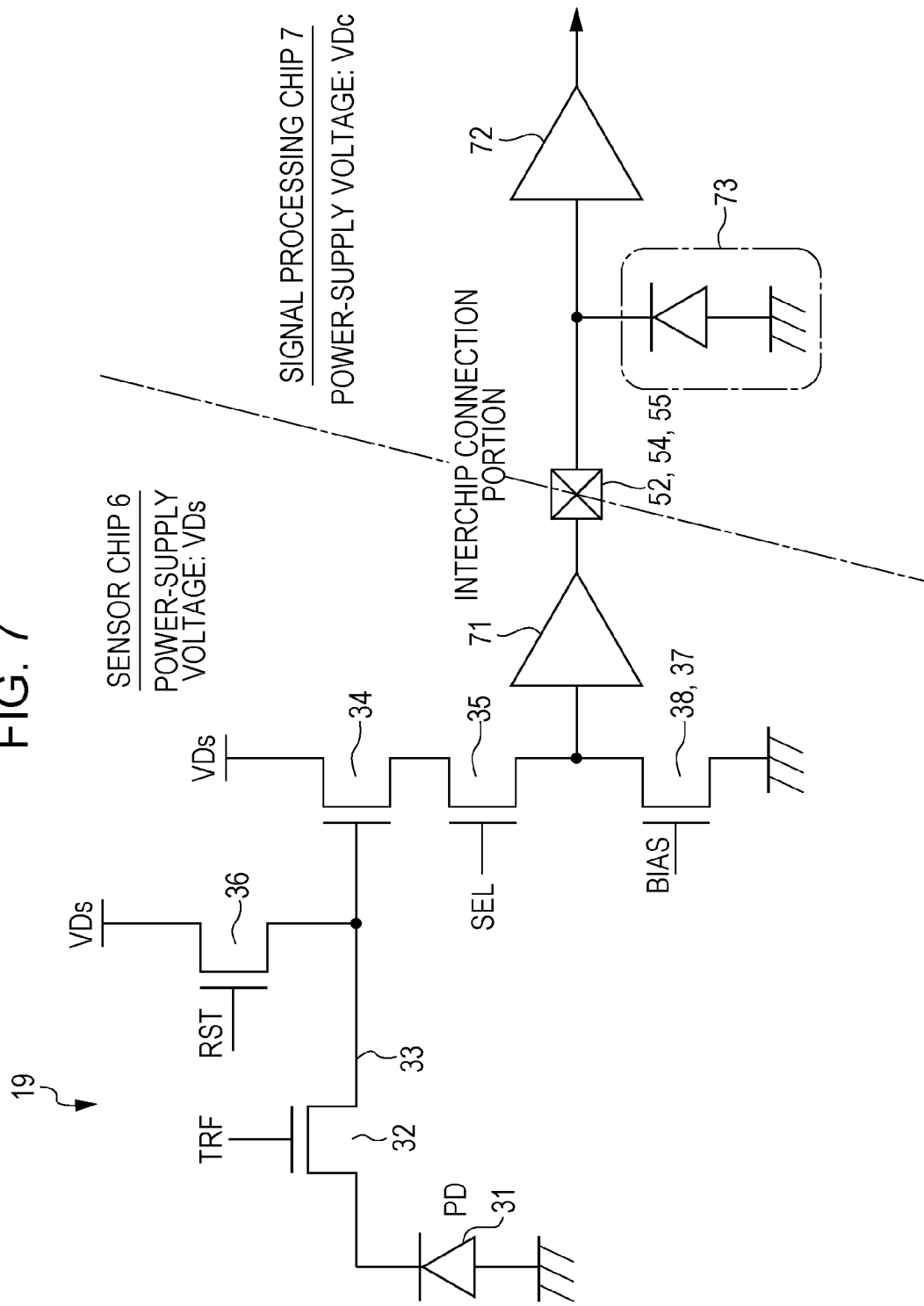

SEMICONDUCTOR INTEGRATED CIRCUIT, ELECTRONIC DEVICE, SOLID-STATE IMAGING APPARATUS, AND IMAGING APPARATUS

CROSS-REFERENCE TO RELATED APPLICATIONS

This application is a continuation of U.S. patent application Ser. No. 15/587,165, filed May 4, 2017, which is a continuation of U.S. patent application Ser. No. 15/487,301, filed Apr. 13, 2017, which is a continuation of U.S. patent application Ser. No. 15/084,792, filed Mar. 30, 2016, now U.S. Pat. No. 9,627,432, which is a continuation of U.S. patent application Ser. No. 14/638,790, filed Mar. 4, 2015, now U.S. Pat. No. 9,691,806, which is a continuation of U.S. patent application Ser. No. 13/218,933, filed Aug. 26, 2011, now U.S. Pat. No. 9,000,501, which claims priority to Japanese Patent Application Serial No. JP 2010-197730, filed in the Japan Patent Office on Sep. 3, 2010, the entire disclosures of which are hereby incorporated herein by reference.

BACKGROUND

The present disclosure relates to a semiconductor integrated circuit in which analog and digital circuits coexist, an electronic device, a solid-state imaging apparatus, and an imaging apparatus.

In recent years, many MOS-type solid-state imaging apparatuses have a plurality of pixel circuits which have a photodiode subjecting light to photoelectric conversion, and a signal processing circuit which converts and processes a pixel signal output from each of the pixel circuits into a digital value.

In a highly-functional or high-speed semiconductor integrated circuit such as this solid-state imaging apparatus, when photodiodes of pixels, or analog and digital circuits are disposed in a semiconductor substrate, a difference in process requirements for the elements which are used, respectively, is large.

As a result, in the semiconductor integrated circuit, an increase in cost due to an increase in the number of processes and a deterioration in sensor characteristics due to a difference in optimum processes, and the like occur.

In a so-called three-dimensional Large Scale Integration (LSI) structure having a structure in which a plurality of chips overlap each other, an LSI can be configured by stacking chips manufactured by different processes. As a result, in the three-dimensional LSI structure, the above-described problems can be solved (Japanese Unexamined Patent Application Publication No. 2004-146816, International Publication No. 2006/129762).

SUMMARY

However, in a semiconductor integrated circuit having a plurality of chips, a plurality of circuit blocks which are realized in the circuit are formed to be divided into the plurality of chips, and thus the total area of the semiconductor substrate increases.

For example, in a digital circuit to which an analog signal is input from an analog circuit formed in another semiconductor substrate, it is necessary to add an input protection circuit since an input terminal of the digital circuit is exposed to the outside by a pad or the like.

In the semiconductor integrated circuit in which the analog and digital circuits coexist as described above, when these circuits are formed to be divided into a plurality of semiconductor substrates, it is necessary to suppress an increase in the total area of the substrate.

A semiconductor integrated circuit according to a first embodiment of the present disclosure includes: a first semiconductor substrate in which a part of an analog circuit is formed between the analog circuit and a digital circuit which subjects an analog output signal output from the analog circuit to digital conversion; a second semiconductor substrate in which the remaining part of the analog circuit and the digital circuit are formed; and a substrate connection portion which connects the first and second semiconductor substrates to each other. The substrate connection portion transmits an analog signal which is generated by a part of the analog circuit of the first semiconductor substrate to the second semiconductor substrate.

In the first embodiment, the analog circuit is formed to be divided into the first and second semiconductor substrates.

Accordingly, a remaining part of the analog circuit of the second semiconductor substrate functions as an input protection circuit of the digital circuit of the second semiconductor substrate.

Therefore, the second semiconductor substrate is not provided with an input protection circuit of the digital circuit.

An electronic device according to a second embodiment of the present disclosure includes: a semiconductor integrated circuit in which an analog circuit and a digital circuit which subjects an analog output signal output from the analog circuit to digital conversion coexist. The semiconductor integrated circuit has a first semiconductor substrate in which a part of the analog circuit is formed, a second semiconductor substrate in which the remaining part of the analog circuit and the digital circuit are formed, and a substrate connection portion which connects the first and second semiconductor substrates to each other. The substrate connection portion transmits an analog signal which is generated by a part of the analog circuit of the first semiconductor substrate to the second semiconductor substrate.

A solid-state imaging apparatus according to a third embodiment of the present disclosure includes: a first semiconductor substrate in which a part of an analog circuit including a plurality of photoelectric conversion elements is formed between the analog circuit including the plurality of photoelectric conversion elements and a digital circuit which subjects an analog output signal output from the analog circuit to digital conversion; a second semiconductor substrate in which the remaining part of the analog circuit and the digital circuit are formed; and a substrate connection portion which connects the first and second semiconductor substrates to each other. The substrate connection portion transmits an analog signal which is generated by a part of the analog circuit of the first semiconductor substrate to the second semiconductor substrate.

An imaging apparatus according to a fourth embodiment of the present disclosure includes: an optical system which collects light; and a solid-state imaging portion which has a plurality of photoelectric conversion elements which subject the light collected by the optical system to photoelectric conversion. The solid-state imaging portion has a first semiconductor substrate in which a part of an analog circuit including a plurality of photoelectric conversion elements is formed between the analog circuit including the plurality of photoelectric conversion elements and a digital circuit which subjects an analog output signal output from the analog circuit to digital conversion, a second semiconductor substrate in which the remaining part of the analog circuit and the digital circuit are formed, and a substrate connection portion which connects the first and second semiconductor substrates to each other. The substrate connection portion transmits an analog signal which is generated by a part of the analog circuit of the first semiconductor substrate to the second semiconductor substrate.

In the present disclosure, when a semiconductor integrated circuit in which analog and digital circuits coexist is formed to be divided into a plurality of semiconductor substrates, it is possible to suppress an increase in the total area of the substrate.

BRIEF DESCRIPTION OF THE DRAWINGS

FIG. 5 is an explanatory diagram of a method of distributing the pixel array portion for one column and the column circuit into the sensor chip and the signal processing chip of FIGS. 3A and 3B.

FIG. 7 is an explanatory diagram of the chip distribution in a solid-state imaging apparatus of a comparative example.

DETAILED DESCRIPTION OF EMBODIMENTS

Hereinafter, embodiments of the present disclosure will be described with reference to the drawings.

The description will be given in the following order.
1. First Embodiment (Example of Solid-State Imaging Apparatus Having CMOS Sensor System)
2. Second Embodiment (Modified Example of Optical Structure of Solid-State Imaging Apparatus)
3. Third Embodiment (Modified Example of Chip Division of Solid-State Imaging Apparatus)
4. Fourth Embodiment (Example of Solid-State Imaging Apparatus Having CCD Sensor System)
5. Fifth Embodiment (Example of Imaging Apparatus)

1. First Embodiment

[Configuration of Solid-State Imaging Apparatus 1 Having CMOS Sensor System]

Figure 1:
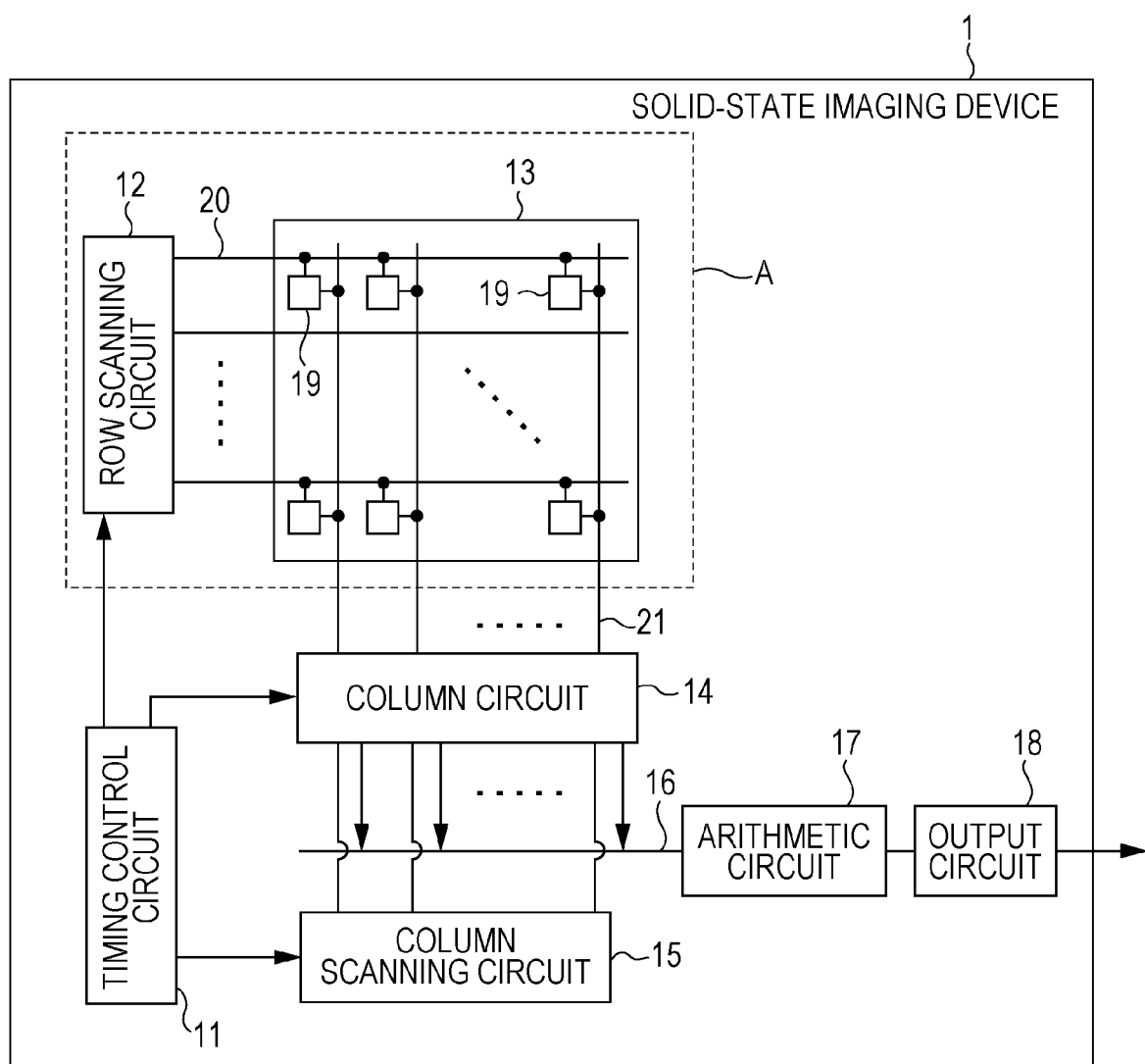
FIG. 1 is a block diagram of a Complementary Metal Oxide Semiconductor (CMOS) sensor-type solid-state imaging apparatus according to a first embodiment of the present disclosure.

FIG. 1 is a block diagram of a solid-state imaging apparatus 1 having a CMOS sensor system according to a first embodiment of the present disclosure.

A solid-state imaging apparatus 1 of FIG. 1 has a timing control circuit 11, a row scanning circuit 12, a pixel array portion 13, a column circuit 14, a column scanning circuit 15, a horizontal scanning output signal line 16, an (Auto Gain Control) arithmetic circuit 17, and an output circuit 18.

The pixel array portion 13 has a plurality of pixel circuits 19 which are two-dimensionally arranged in a matrix in one surface of a semiconductor substrate.

The plurality of pixel circuits 19 are connected to a plurality of row selection signal lines 20 for each row. The plurality of row selection signal lines 20 are connected to the row scanning circuit 12.

In addition, the plurality of pixel circuits 19 are connected to a plurality of column output signal lines 21 for each column. The plurality of column output signal lines 21 are connected to the column circuit 14.

Figure 2:
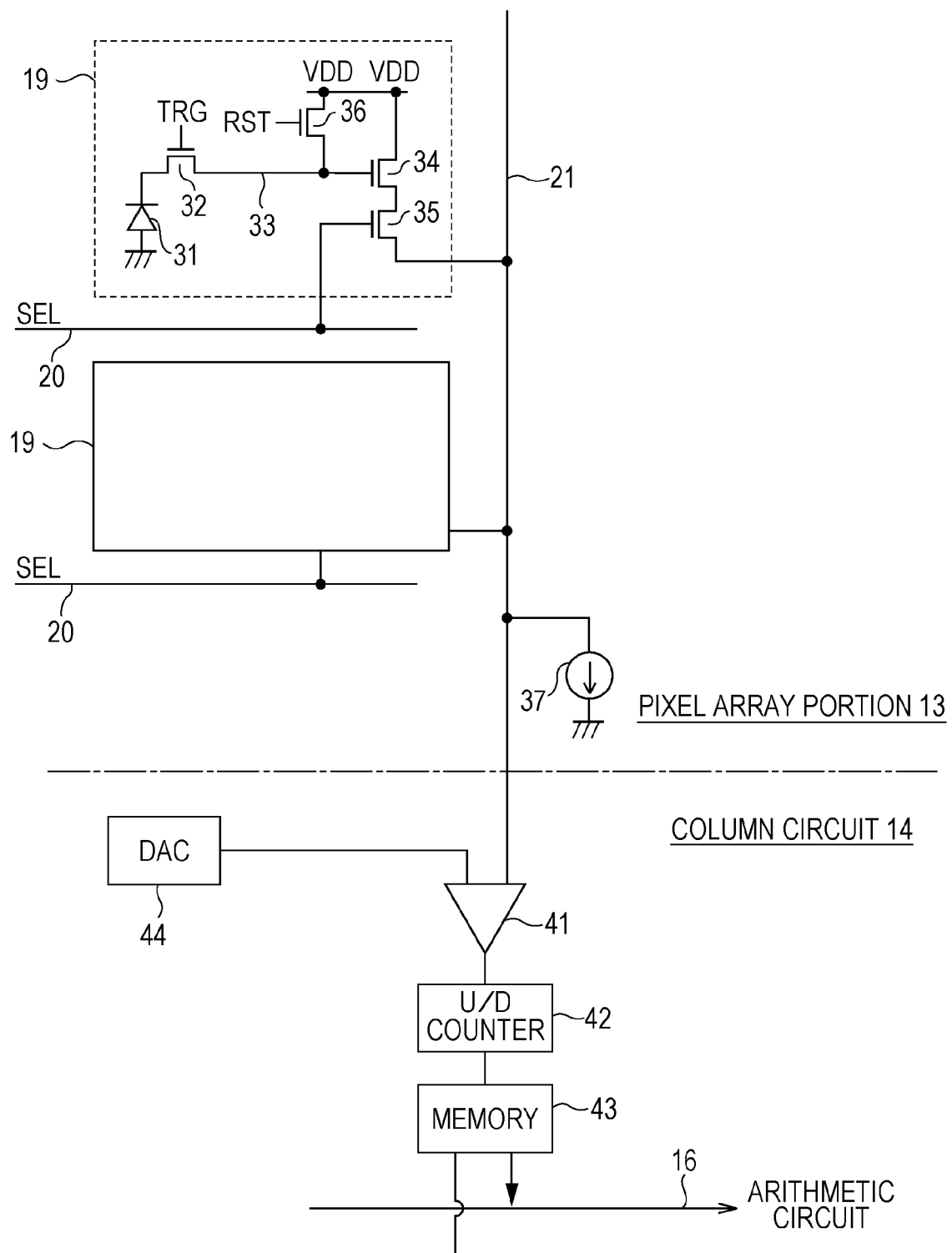
FIG. 2 is a circuit diagram of a pixel array portion for one column of FIG. 1 and a column circuit.

FIG. 2 is a circuit diagram of the pixel array portion 13 for one column of FIG. 1 and the column circuit 14.

As shown in FIG. 2, the plurality of pixel circuits 19 which are arranged in a column are connected to a column output signal line 21.

The pixel circuit 19 of FIG. 2 has a photodiode 31, a transmission transistor 32, a floating diffusion (FD) 33, an amplification transistor 34, a selection transistor 35, and a reset transistor 36.

The transmission transistor 32, the amplification transistor 34, the selection transistor 35, and the reset transistor 36 are, for example, Metal Oxide Semiconductor (MOS) transistors formed in a semiconductor substrate.

The photodiode 31 subjects incident light to photoelectric conversion into a charge (here, electrons) of an amount according to the light intensity thereof.

In the transmission transistor 32, the drain is connected to the photodiode 31, the source is connected to the FD 33, and the gate is connected to a transmission signal line (not shown).

When the transmission transistor 32 is turned on, it transmits a charge generated by the photodiode 31 to the floating diffusion 33.

In the reset transistor 36, the drain is connected to a power supply Vdd, the source is connected to the FD 33, and the gate is connected to a reset signal line (not shown).

When the reset transistor 36 is turned on, it resets the FD 33 to the electric potential of the power supply Vdd.

In the amplification transistor 34, the drain is connected to the power supply Vdd, the source is connected to the drain of the selection transistor 35, and the gate is connected to the FD 33.

In the selection transistor 35, the drain is connected to the source of the amplification transistor 34, the source is connected to the column output signal line 21, and the gate is connected to the row selection signal line 20.

In addition, the column output signal line 21 is connected to a current supply 37.

In this manner, the amplification transistor 34 constitutes a source follower-type amplifier when the selection transistor 35 is turned on.

When the selection transistor 35 is turned on, the amplification transistor 34 outputs a pixel signal (analog signal) according to the electric potential of the FD 33 to the column output signal line 21.

In addition, in the pixel circuit 19 of FIG. 2, the photodiode 31 and the FD 33 are reset due to, for example, the turning-on of the transmission transistor 32 and the reset transistor 36. The voltage level after the reset of the FD 33 becomes the power supply Vdd.

Thereafter, when the transmission transistor 32 is turned on, the charge generated by the photodiode 31 after the reset is transmitted to the FD 33. The voltage level of the FD 33 becomes a voltage according to the quantity of the charge.

In addition, when the selection transistor 35 is turned on, the amplification transistor 34 outputs the pixel signal of a level according to the voltage level of the FD 33 input to the gate to the column output signal line 21.

The row scanning circuit 12 of FIG. 1 is connected to the timing control circuit 11 and the plurality of row selection signal lines 20.

The row scanning circuit 12 selects the plurality of row selection signal lines 20 in sequence on the basis of a vertical synchronization signal input from the timing control circuit 11. The row scanning circuit 12 selects the plurality of row selection signal lines 20 in sequence for each horizontal scanning period.

The pixel circuit 19 connected to a selected row selection signal line 20 outputs an analog pixel signal of a level according to the quantity of the charge which is generated by the photoelectric conversion of the photodiode 31 to the column output signal line 21.

As shown in FIG. 2, the column circuit 14 has a plurality of sets of a comparator 41, an up/down counter 42, and a memory 43 on a column to column basis.

In the comparator 41, one of a pair of input terminals is connected to the column output signal line 21, and the other is connected to a DA converter (DAC) 44. The DAC 44 outputs a lamp signal, the level of which is changed in the manner of a lamp, on the basis of a value input from the timing control circuit 11.

The comparator 41 compares the level of a lamp signal which is input from the DAC 44 with the level of a pixel signal which is input from the column output signal line 21.

For example, when the level of a pixel signal is lower than the level of a lamp signal, the comparator 41 outputs a high-level comparison signal. When the level of a pixel signal is higher than the level of a lamp signal, the comparator 41 outputs a low-level comparison signal.

The up/down counter 42 is connected to the comparator 41.

The up/down counter 42 counts, for example, a period during which the level of a comparison signal is high or low. Due to this counting, the pixel signal of each pixel circuit 19 is converted into a complete digital value.

An AND circuit may be provided between the comparator 41 and the up/down counter 42 and the number of pulse signals, which are input to this AND circuit, may be counted by the up/down counter 42.

The memory 43 is connected to the up/down counter 42, the horizontal scanning output signal line 16, and the column scanning circuit 15.

The memory 43 stores the count value counted by the up/down counter 42.

In addition, the column circuit 14 may count a count value corresponding to a reset level on the basis of a pixel signal when the pixel circuit 19 is reset, may count a count value on the basis of a pixel signal after a predetermined imaging time, and may store a difference value therebetween in the memory 43.

The column scanning circuit 15 of FIG. 1 is connected to the timing control circuit 11 and the plurality of memories 43 of the column circuit 14.

The column scanning circuit 15 selects the plurality of memories 43 in sequence on the basis of a horizontal synchronization signal input from the timing control circuit 11. A selected memory 43 outputs a signal including a stored count value to the horizontal scanning output signal line 16.

In this manner, for each horizontal synchronization, a plurality of count values in which pixel signals of a plurality of pixel circuits 19 in one row are digitalized are output to the horizontal scanning output signal line 16.

The arithmetic circuit 17 is connected to the horizontal scanning output signal line 16.

The arithmetic circuit 17 subjects a signal received from the horizontal scanning output signal line 16 to addition and the like to convert the signal into a data array adapted to the output specification.

The output circuit 18 is connected to the arithmetic circuit 17.

[Method of Distributing Circuits into Sensor Chip 6 and Signal Processing Chip 7]

Figure 3A:
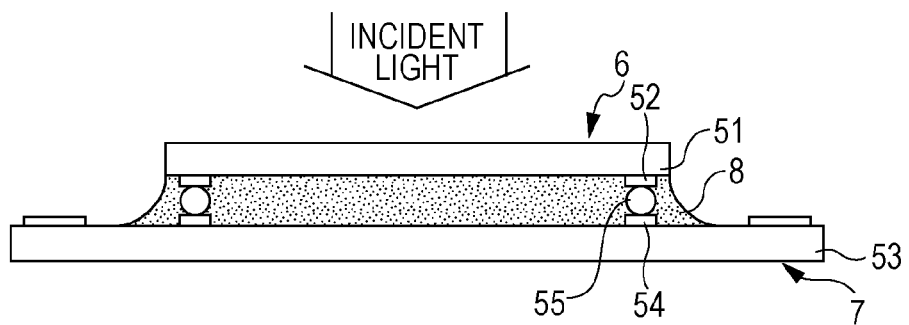
FIGS. 3A and 3B are explanatory diagrams of the three-dimensional structure of the solid-state imaging apparatus of FIG. 1.
Figure 3B:
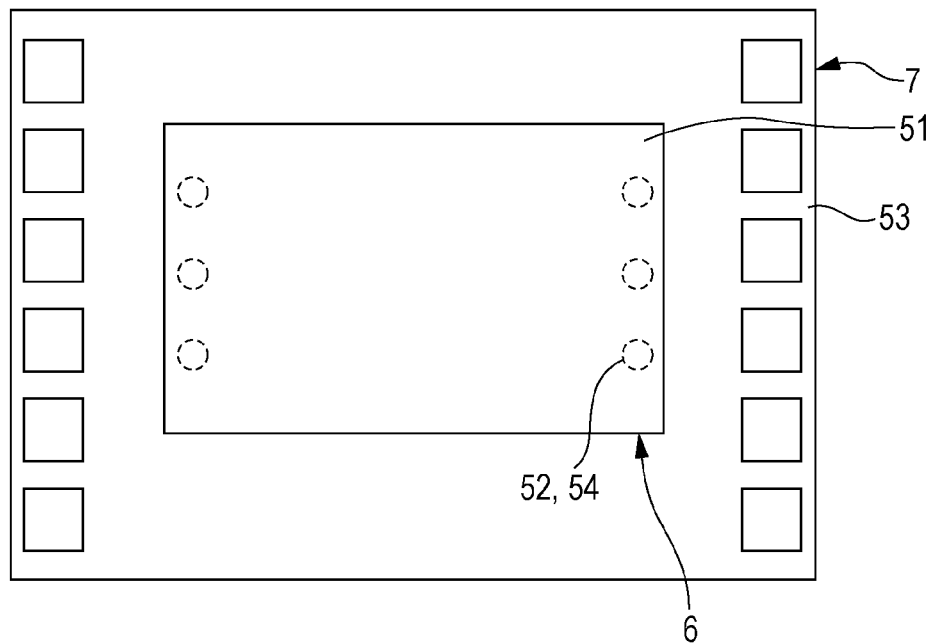

FIGS. 3A and 3B are explanatory diagrams of the three dimensional structure of the solid-state imaging apparatus 1 of FIG. 1.

FIG. 3A is a side view of the solid-state imaging apparatus 1 of FIG. 1. FIG. 3B is a front view of the solid-state imaging apparatus 1 of FIG. 1.

The solid-state imaging apparatus 1 of FIGS. 3A and 3B has a sensor chip 6, a signal processing chip 7, and a sealing resin 8.

The sensor chip 6 has a rectangular first semiconductor substrate 51 and a plurality of micropads 52 which are arranged in the central part of the back surface of the first semiconductor substrate 51.

The signal processing chip 7 has a rectangular second semiconductor substrate 53 which is larger than the first semiconductor substrate 51, a plurality of pads which are arranged in both of the end parts in the longitudinal direction of the second semiconductor substrate 53, and a plurality of micropads 54 which are arranged in the central part of the upper surface of the second semiconductor substrate 53.

The first semiconductor substrate 51 of the sensor chip 6 is disposed to overlap with the central part of the second semiconductor substrate 53 of the signal processing chip 7.

In addition, the plurality of micropads 52 arranged in the back surface of the first semiconductor substrate 51 and the plurality of micropads 54 arranged in the surface of the second semiconductor substrate 53 are electrically connected to each other by a plurality of microbumps 55.

The first and second semiconductor substrates 51 and 53 are fixed to each other by the sealing resin 8.

In FIGS. 3A and 3B, the upper surface of the first semiconductor substrate 51 is a light sensing surface.

A plurality of circuit blocks of the solid-state imaging apparatus 1 of FIG. 1 are formed to be distributed into the sensor chip 6 and the signal processing chip 7 of FIGS. 3A and 3B.

In general, a plurality of circuit blocks are distributed into a plurality of chips for each circuit block.

In the solid-state imaging apparatus 1, since the sensor chip 6 has a light sensing surface, for example, the pixel array portion 13 is considered to be formed in the sensor chip 6.

In this case, the remaining digital circuit, that is, the timing control circuit 11, the row scanning circuit 12, the column circuit 14, the row scanning circuit 15, the horizontal scanning output signal line 16, the arithmetic circuit 17, and the output circuit 18 are formed in the signal processing chip 7.

In this manner, since the analog circuit of the solid-state imaging apparatus 1 is formed in the sensor chip 6 and the remaining digital circuit is formed in the signal processing chip 7, the analog and digital circuits can be formed in separate semiconductor substrates.

Accordingly, the sensor chip 6 can be formed with a semiconductor substrate suitable as the analog circuit and a manufacturing process thereof, and the signal processing chip 7 can be formed with a semiconductor substrate suitable for the column circuit 14, the column scanning circuit 15 and the like which carry out a high-speed digital operation and a manufacturing method thereof.

As a result, the performances of the analog and digital circuits can be balanced at a high level, as compared with the case in which the plurality of circuit blocks of FIG. 1 are formed in one semiconductor substrate.

Particularly, in the case of a CMOS image sensor, an increase in cost due to an increase in the number of processes and a deterioration in sensor characteristics due to a difference in optimum processes are generated due to a difference in process requirements for the case in which the analog pixel array portion 13 and the logic circuit are formed in the same semiconductor substrate.

However, in a so-called three-dimensional LSI structure having a structure in which chips are stacked, one LSI can be configured by stacking chips of different processes, and thus the above-described problems can be solved.

In addition, in the three-dimensional LSI structure, a number of connections can be made between the chips with a pitch which is narrower than that between the chip and the package and can be made by chip internal wiring, not by a so-called interface circuit.

For these reasons, the three-dimensional LSI structure can be said as a structure effective for a high-speed and highly-functional CMOS image sensor.

However, in the stacking of the chips, which part of the circuit is divided and the inter-chip connection is made at is important in its effect on the circuit.

An interface circuit which is necessary for connection by a bonding wire between the chips has an electrostatic breakdown preventing function and also contributes to the suppression of a breakdown due to an electrical charge caused by a plasma device or the like in the manufacturing process.

Since the stacked chip configuration employs the plurality of micropads 52 and 54, the same level of electrostatic care as in a traditional interface is not carried out. However, it is necessary to prevent the electrostatic breakdown in the inter-wafer connection process.

When such an electrostatic protection element is provided for each connection terminal, the area of the connection part increases and the load capacity of the circuit of the connection part increases.

Accordingly, as described above, for example, when the pixel array portion 13 is formed in the sensor chip 6, the inter-chip connection is made for each readout circuit which is disposed for each column in the image sensor, and thus the number of connections increases.

As a result, the occupancy area of the connection terminal group increases and this puts pressure on the circuit area.

In addition, an increase in the capacity load due to the connection of the protection circuit leads to an increase in the amount of charge and discharge when the signal is transmitted, and thus power consumption increases.

At the same time, in a so-called CMOS logic circuit, when the waveform of an input signal becomes extremely dull, a through current is generated from the power supply to the GND and power consumption further increases.

In addition, in order to suppress the increase in power consumption, several stages of buffer circuits are used to increase the size of the transistor on the transmission side to thereby increase the current supply capability, and thus the area increases.

A specific description thereof will be given.

As described above, for example, when the pixel array portion 13 of FIG. 2 is formed in the sensor chip 6 and the column circuit 14 is formed in the signal processing chip 7, the input terminal of the comparator 41 of the column circuit 14 of FIG. 2 is connected to the micropad 54. The micropad 54 is connected to the column output signal line 21 via the microbump 55 and the micropad 52.

In the manufacturing process, when electrostatic noise is input to the input terminal of the comparator 41, the comparator 41 may be damaged.

Therefore, in the signal processing chip 7, an input protection circuit is added between the input terminal of the comparator 41 and the micropad 54 connected to the input terminal.

In addition, it is necessary to add a driving circuit to the analog circuit which drives the digital circuit formed in another chip 7 and increase the driving capability. The driving circuit at the output stage which is formed for the above-described desire has a large area.

In the pixel array portion 13, since the amplification transistor 34 of the pixel circuit 19 is formed as a source follower circuit using the current supply 37 as a load, this does not become a problem.

For these reasons, in the case of the distribution into the sensor chip 6 and the signal processing chip 7 for each circuit block so as to form the pixel array portion 13 in the sensor chip 6 and form the column circuit 14 in the signal processing chip 7, the total area of the semiconductor substrate increases due to the generation of the additional circuit.

Figure 4:
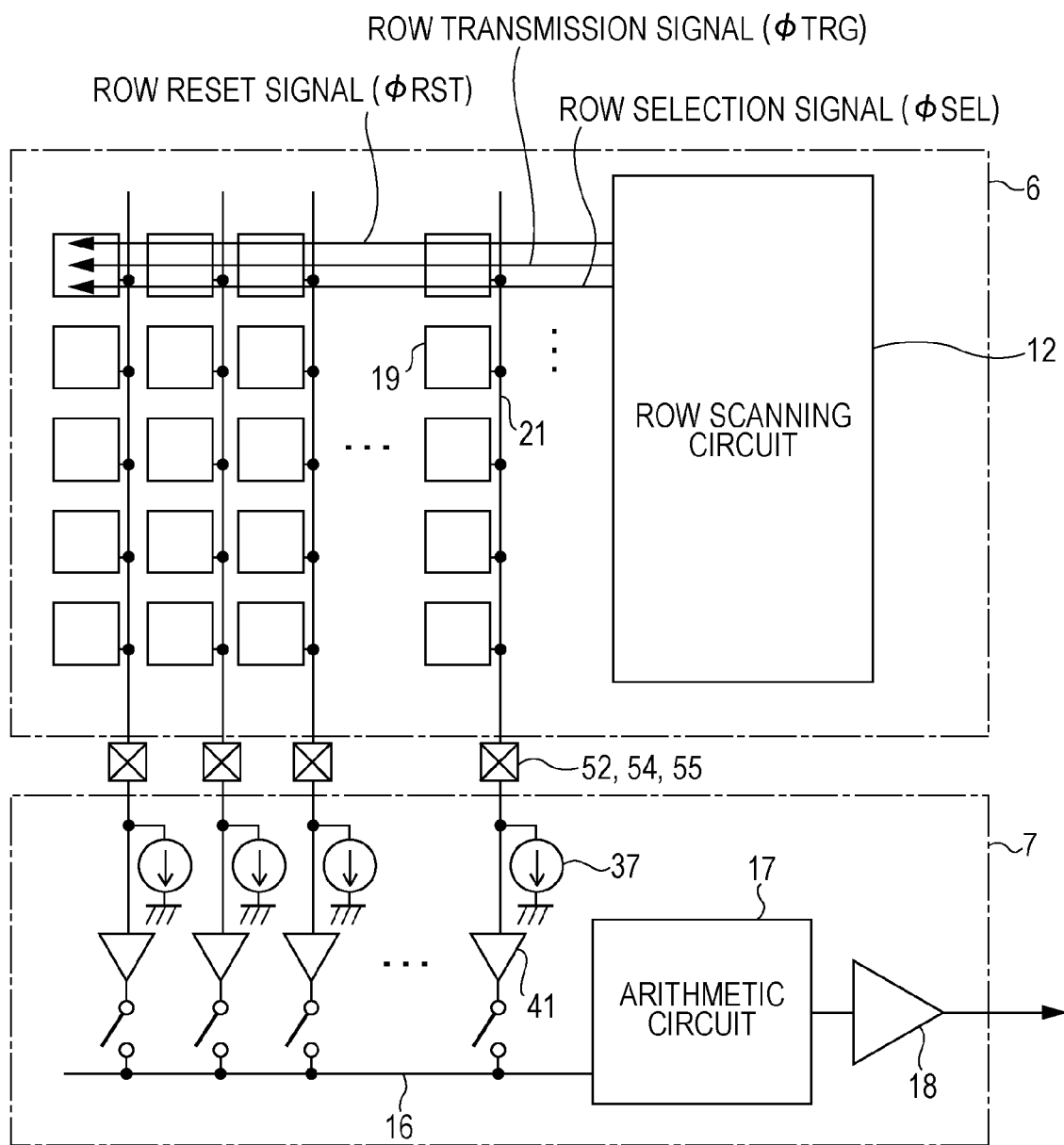
FIG. 4 is an explanatory diagram of a method of distributing the pixel array portion and the column circuit into a sensor chip and a signal processing chip of FIGS. 3A and 3B.

FIG. 4 is an explanatory diagram of a method of distributing the pixel array portion 13 and the column circuit 14 into the sensor chip 6 and the signal processing chip 7 of FIGS. 3A and 3B.

FIG. 5 is an explanatory diagram of a method of distributing the pixel array portion 13 for one column and the column circuit 14 into the sensor chip 6 and the signal processing chip 7 of FIGS. 3A and 3B.

In this embodiment, distribution is not carried out for each circuit block, but a part of the analog circuit is distributed into the sensor chip 6, and the remaining part of the analog circuit and the digital circuit are distributed into the signal processing chip 7.

Specifically, as shown in FIGS. 4 and 5, in the sensor chip 6, the plurality of pixel circuits 19 of the pixel array portion 13 which are a part of the analog circuit and the row scanning circuit 12 of the digital circuit are formed.

In addition, the plurality of current supplies 37 of the pixel array portion 13 which are the remaining part of the analog circuit, and the column circuit 14, the column scanning circuit 15, the horizontal scanning output signal line 16, the timing control circuit 11, the arithmetic circuit 17, and the output circuit 18 as the digital circuit are formed in the signal processing chip 7.

The row canning circuit 12 is a digital circuit. However, here, the row canning circuit 12 is formed in the sensor chip 6.

This is because the row scanning circuit 12 is a circuit which operates relatively slowly to switch the signal for each horizontal scanning period, does not operate rapidly as the column circuit 14 and the like, and does not have high digital characteristics.

In addition, the row scanning circuit 12 and the pixel array portion 13 are connected to each other by the many row selection signal lines 20.

Accordingly, when the row scanning circuit 12 is formed in the signal processing chip 7, it is necessary to connect these many row selection signal lines 20 by microbumps 55 and thus a lot of microbumps 55 are used.

Figure 6A:
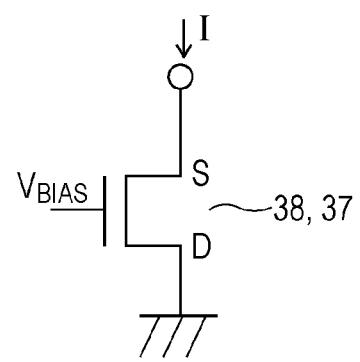
FIGS. 6A and 6B are explanatory diagrams of a current supply of the pixel array portion formed in the signal processing chip of FIGS. 3A and 3B.
Figure 6B:
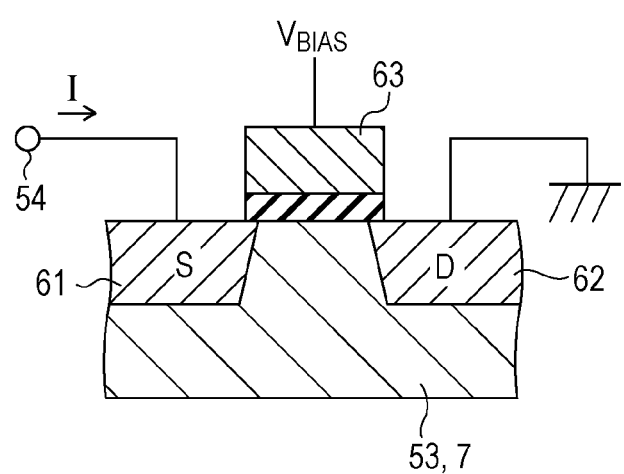

FIGS. 6A and 6B are explanatory diagrams of the current supply 37 of the pixel array portion 13 formed in the signal processing chip 7 of FIGS. 3A and 3B.

FIG. 6A is a circuit diagram of the current supply 37.

FIG. 6B is a schematic cross-sectional diagram of the second semiconductor substrate 53 of the signal processing chip 7.

As described above, the current supply 37 of the pixel array portion 13 is a part of the pixel array portion 13 as the analog circuit, but is allowed to be formed in the signal processing chip 7.

In addition, the current supply 37 of the pixel array portion 13 has a current supply transistor 38 connected to the column output signal line 21.

The current supply transistor 38 is, for example, an MOS transistor.

In the current supply transistor 38, the source is connected to the micropad 54 of the signal processing chip 7, the drain is connected to the ground, and the gate is connected to a bias supply (not shown).

Therefore, the current supply transistor 38 functions as a current supply 37 of the current according to the bias voltage of the bias supply.

As shown in FIG. 6B, this current supply transistor 38 has a source diffusion layer 61 which is formed in the second semiconductor substrate 53, a drain diffusion layer 62, and a gate wiring portion 63 which is stacked via the second semiconductor substrate 53 and an oxide film (thin insulating film).

The source diffusion layer 61 is connected to the micropad 54 of the signal processing chip 7 by wiring.

The drain diffusion layer 62 is connected to the ground of the signal processing chip 7 by wiring.

Since the source node of the current supply transistor 38 is connected to the micropad 54 of the signal processing chip 7 as in FIG. 6B, the micropad 54 is connected to the diffusion layer of the current supply transistor 38.

Therefore, the diffusion layers 61 and 62 of the current supply transistor 38 function as a protection circuit to allow the electrostatic noise input from the micropad 54 of the signal processing chip 7 to escape to the ground.

That is, since the electrostatic noise input from the micropad 54 of the signal processing chip 7 escapes to the ground from the current supply 37 in FIG. 4, it becomes difficult for the electrostatic noise to be input to the input terminal of the comparator 41 of the column circuit 14.

Comparative Example: Comparative Example of Method of Distributing Circuits into Sensor Chip 6 and Signal Processing Chip 7

FIG. 7 is an explanatory diagram of the chip distribution in the solid-state imaging apparatus 1 of a comparative example.

In the comparative example of FIG. 7, an AD converter 71 which is connected to the current supply 37 and the column output signal line 21 is provided in the sensor chip 6, and a digital output signal of this AD converter 71 is connected to the micropad 52.

In addition, in the comparative example of FIG. 7, a CMOS buffer 72 and a protection diode 73 are connected to the micropad 54 of the signal processing chip 7.

The CMOS buffer 72 is connected to, for example, one input terminal of the comparator 41 of the column circuit 14.

In this comparative example of FIG. 7, all of the circuits of the pixel array portion 13 as the analog circuit are provided in the sensor chip 6, and all of portions of the column circuit 14 as the digital circuit are provided in the signal processing chip 7.

In addition, due to the protection diode 73, the electrostatic noise in the manufacturing process which is input from the micropad 54 of the signal processing chip 7 escapes to the ground.

Due to the protection diode 73, the input terminal of the CMOS buffer 72 is protected.

However, in the circuit of the comparative example, the AD converter 71 is added to the sensor chip 6, and the CMOS buffer 72 and the protection diode 73 are added to the signal processing chip 7.

As a result, in the circuit of the comparative example, the total area of the semiconductor substrate significantly increases since the circuit block of the solid-state imaging apparatus 1 is divided into two chips.

[Optical Layout]

Figure 8:
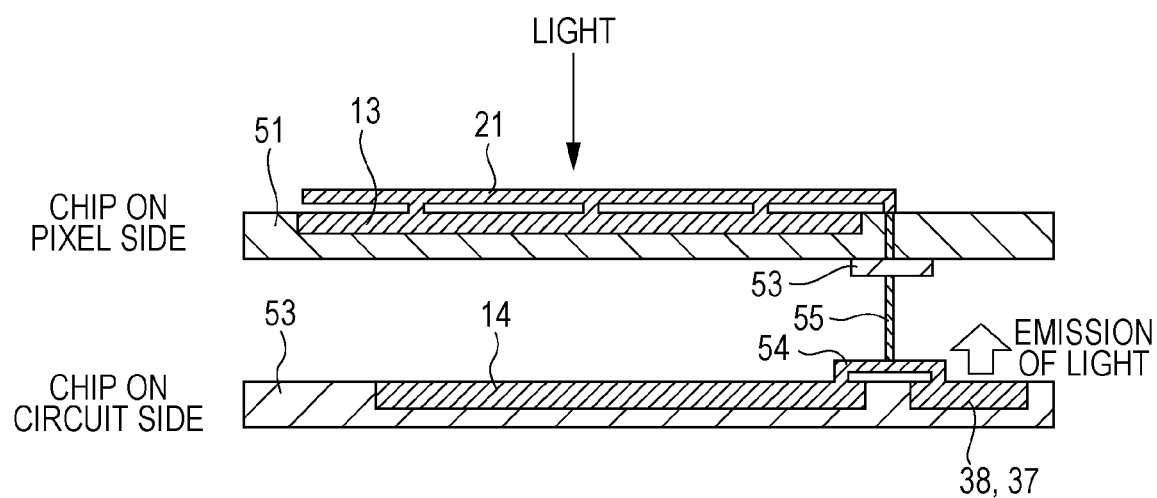
FIG. 8 is an explanatory diagram of the optical structures of the sensor chip and the signal processing chip of FIG. 2.

FIG. 8 is an explanatory diagram of the optical structures of the sensor chip 6 and the signal processing chip 7 of FIG. 2.

As shown in FIG. 8, the first semiconductor substrate 51 of the sensor chip 6 is disposed to overlap on the second semiconductor substrate 53 of the signal processing chip 7.

The upper surface of the first semiconductor substrate 51 has the plurality of pixel circuits 19 formed therein, and the column output signal line 21 and the like are disposed in the upper surface of the first semiconductor substrate 51.

In addition, the upper surface of the second semiconductor substrate 53 has the digital circuit such as the column circuit 14 and the like, the current supply 37, and the like formed therein.

The column output signal line 21 formed in the upper surface of the first semiconductor substrate 51 is connected to the micropad 52 of the back surface of the first semiconductor substrate 51, and is connected to the micropad 54 of the upper surface of the second semiconductor substrate 53 due to the microbump 55.

When an MOS transistor is used as the current supply 37, a high voltage is applied between the gate and the source of this MOS transistor.

A power-supply voltage VDD which is generated by the first semiconductor substrate 51 is applied. When the voltage between the gate and the source increases, the MOS transistor may emit light caused by hot carrier due to the current flowing in a PN junction surface such as the substrate.

When the current supply transistor 38 formed in the second semiconductor substrate 53 emits light, the light may enter the photodiode 31 of the first semiconductor substrate 51.

Accordingly, in the first embodiment, as shown in FIG. 8, the column circuit 14 and the like are formed in a position which overlaps with the plurality of pixel circuits 19 in the second semiconductor substrate 53, and the current supply 37 is formed in a position which does not overlap with the plurality of pixel circuits 19.

In this manner, in the first embodiment, the current supply 37 formed in the second semiconductor substrate 53 is formed in a position which does not overlap with the pixel array portion 13 of the first semiconductor substrate 51.

Therefore, even when the current supply transistor 38 emits light, the light does not enter the photodiode 31 of the first semiconductor substrate 51.

As described above, in the first embodiment, among the plurality of pixel circuits 19 and the current supply 37 constituting the analog circuit, the current supply 37 is formed using the transistor in the signal processing chip 7.

In this manner, the current supply transistor 38 can also be allowed to function as the input protection circuit of the digital circuit.

As a result, it is not necessary to newly add the input protection circuit of the digital circuit, and thus an increase in the load and an increase in the area can be suppressed.

In addition, in the first embodiment, the solid-state imaging apparatus 1 is divided into two chips in the column output signal line 21 to which a source follower circuit is connected.

A CMOS image sensor has a source follower circuit which shares the current supply transistor 38 with the plurality of pixel circuits 19. Originally, between the amplification transistor 34 as a driver of this source follower circuit and the current supply transistor 38, high wiring resistance and large diffusion layer capacity and wiring capacity are present. Even when the resistance and the capacity caused by the inter-chip connection are added to this part, the analog characteristics are not heavily affected.

In this manner, in the first embodiment, the effect of the resistance and the capacity of the connection portion in the inter-chip connection can be reduced, and the risk of destruction of the transistor due to a damage during the manufacturing process can be reduced.

2. Second Embodiment

The circuit blocks of a solid-state imaging apparatus 1, the method of distributing the circuit blocks into a sensor chip 6 and a signal processing chip 7, and the configuration of a current supply transistor 38 in a second embodiment are the same as in the first embodiment.

That is, a plurality of pixel circuits 19 of a pixel array portion 13 are formed in the sensor chip 6, and the current supply transistor 38 is formed in the signal processing chip 7 as in the case of a column circuit 14 and the like.

Accordingly, in the second embodiment, the same symbols as in the first embodiment will be used for the portions in the solid-state imaging apparatus 1 and descriptions thereof will be omitted.

[Optical Layout]

Figure 9:
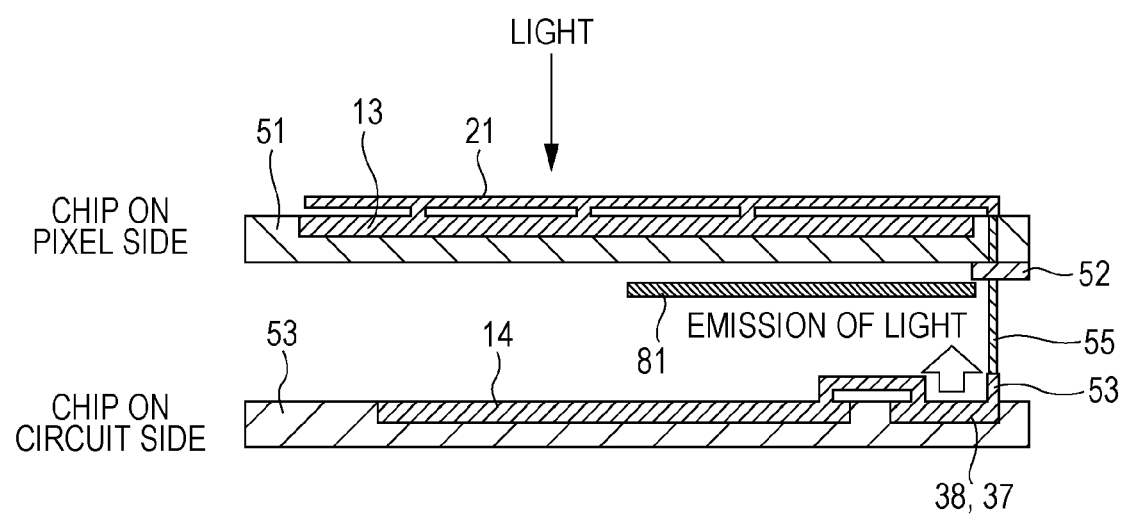
FIG. 9 is an explanatory diagram of the optical structures of a sensor chip and a signal processing chip in a second embodiment of the present disclosure.

FIG. 9 is an explanatory diagram of the optical structures of the sensor chip 6 and the signal processing chip 7 in the second embodiment of the present disclosure.

In the second embodiment, as shown in FIG. 9, a current supply 37 is formed in addition to the column circuit 14 and the like in a position which overlaps with the plurality of pixel circuits 19 in a second semiconductor substrate 53.

In addition, in the second embodiment, a light-shielding metal film 81 is disposed between the first and second semiconductor substrates 51 and 53. The light-shielding metal film 81 may be formed of, for example, aluminum, copper, or the like.

In this manner, for example, even when the current supply transistor 38 emits light, the light does not enter a photodiode 31 of the first semiconductor substrate 51.

In the second embodiment, the light-shielding metal film 81 is disposed between the first and second semiconductor substrates 51 and 53.

In addition, the light-shielding metal film 81 may also be disposed between the current supply transistor 38 and the plurality of pixel circuits 19 by forming the wiring layer at the top of the second semiconductor substrate 53 in a solid pattern.

Moreover, the light-shielding metal film 81 may also be disposed between the current supply transistor 38 and the plurality of pixel circuits 19 by forming in a metal solid pattern on the back surface of the first semiconductor substrate 51.

For example, in the case of a so-called back surface irradiation type in which the back surface of the first semiconductor substrate 51 has a wiring layer formed thereon, a solid pattern may be formed in the uppermost layer of the wiring layer on the back surface.

In addition, in place of the light-shielding metal film 81 and the metal solid pattern, a light-absorbing film or a light-scattering film may be provided between the first and second semiconductor substrates 51 and 53. For example, the light can be scattered or absorbed by applying a silicon-based adhesive between the first and second semiconductor substrates 51 and 53.

3. Third Embodiment

The circuit blocks of a solid-state imaging apparatus 1 and the configuration of a current supply transistor 38 in a third embodiment are the same as in the first embodiment.

That is, a plurality of pixel circuits 19 of a pixel array portion 13 are formed in a sensor chip 6, and the current supply transistor 38 is formed in a signal processing chip 7 as in the case of a column circuit 14 and the like.

Accordingly, in the third embodiment, the same symbols as in the first embodiment will be used for the portions in the solid-state imaging apparatus 1 and descriptions thereof will be omitted.

[Method of Distributing Circuits into Sensor Chip 6 and Signal Processing Chip 7]

Figure 10:
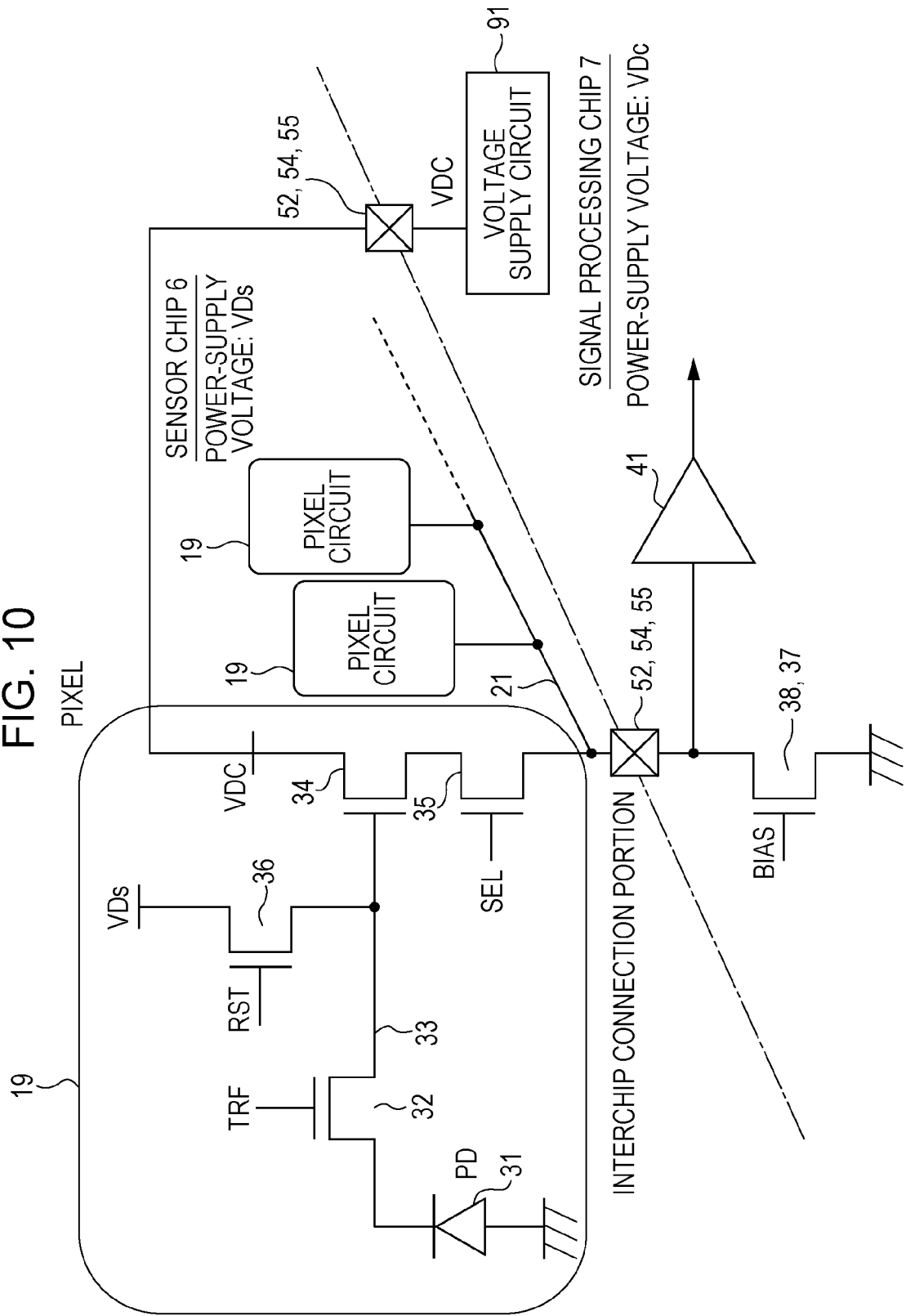
FIG. 10 is an explanatory diagram of a method of distributing a pixel array portion for one column and a column circuit into a sensor chip and a signal processing chip of a third embodiment of the present disclosure.

FIG. 10 is an explanatory diagram of a method of distributing the pixel array portion 13 for one column and the column circuit 14 into the sensor chip 6 and the signal processing chip 7 of the third embodiment of the present disclosure.

In the solid-state imaging apparatus 1 of FIG. 10, a voltage supply circuit 91 which supplies an amplifier power-supply voltage VDC to the pixel array portion 13 of the sensor chip 6 is formed in the signal processing chip 7.

The voltage supply circuit 91 is connected to micropads 54 of a second semiconductor substrate 53 of the signal processing chip 7, and is connected to micropads 52 of a first semiconductor substrate 51 by microbumps 55. The micropad 52 is connected to the drain of an amplification transistor 34 of each of the plurality of pixel circuits 19.

As in the first embodiment, the drain of a reset transistor 36 of each of the plurality of pixel circuits 19 is supplied with the power-supply voltage VDD from the circuit (not shown) of a current supply 37 formed in the sensor chip 6.

The power-supply voltage VDC which is supplied to the drain of the amplification transistor 34 by the voltage supply circuit 91 of FIG. 10 is lower than the power-supply voltage VDD.

Accordingly, in the signal processing chip 7, it is not necessary to use a high breakdown voltage element or the like to deal with the high power-supply voltage of the sensor chip 6. In addition, 1/f noise can be reduced by using a low breakdown voltage element in the signal processing chip 7.

4. Fourth Embodiment

A solid-state imaging apparatus 1 of a fourth embodiment is a CCD sensor-type apparatus different from the CMOS sensor-type apparatus of the first to third embodiments.

[Configuration of CCD Sensor-Type Solid-State Imaging Apparatus 1 and Chip Distribution Method]

Figure 11:
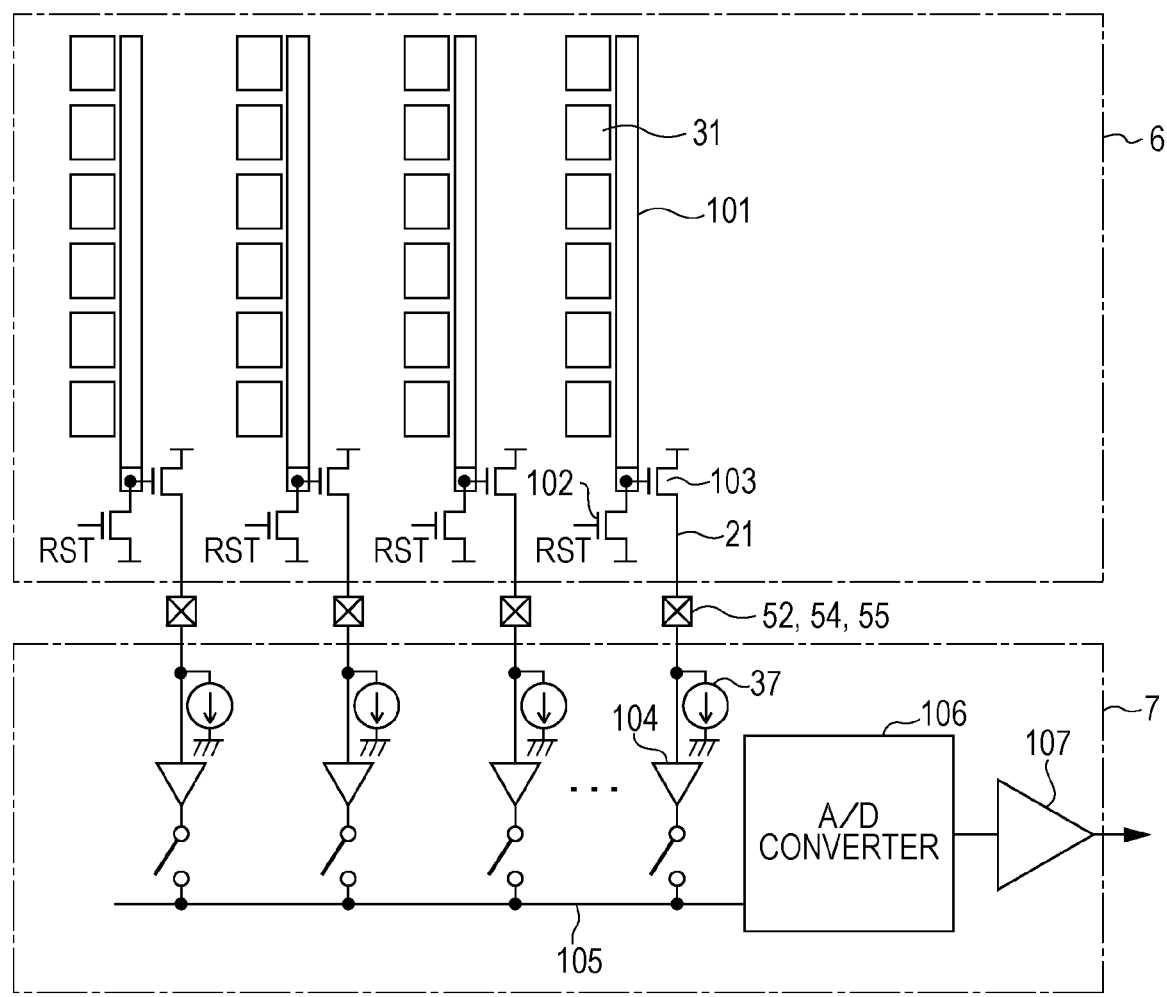
FIG. 11 is an explanatory diagram of the configuration of a Charge Coupled Device (CCD) sensor-type solid-state imaging apparatus of a fourth embodiment of the present disclosure and a chip distribution method.

FIG. 11 is an explanatory diagram of the configuration of a solid-state imaging apparatus 1 of the fourth embodiment of the present disclosure and a chip distribution method.

The solid-state imaging apparatus 1 of FIG. 11 has a plurality of photodiodes 31, a plurality of vertical transmission portions 101, a plurality of reset transistors 102, a plurality of amplification transistors 103, a plurality of column output signal lines 21, a plurality of current supplies 37, a plurality of amplifiers 104, and a horizontal transmission signal line 105. These circuits are analog circuits which deal with an analog signal.

In addition, the solid-state imaging apparatus 1 of FIG. 11 has an AD converter 106 and an output buffer 107. These circuits are digital circuits which convert and process the analog signal into a digital value.

The plurality of photodiodes 31 are two-dimensionally arranged in a first semiconductor substrate 51 of a sensor chip 6.

The vertical transmission portions 101 are formed in the first semiconductor substrate 51 so as to be adjacent to the plurality of photodiodes 31 of each column.

The reset transistors 102 are, for example, MOS transistors. The reset transistor 102 is connected to an end part in the charge transmission direction of each vertical transmission portion 101 in the first semiconductor substrate 51. In the reset transistor 102, the source is connected to the vertical transmission portion 101 and the drain is connected to a power-supply voltage.

The amplification transistors 103 are, for example, MOS transistors. The amplification transistor 103 is connected to an end part in the charge transmission direction of each vertical transmission portion 101 in the first semiconductor substrate 51. In the amplification transistor 103, the source is connected to a power-supply voltage, the drain is connected to the column output signal line 21, and the gate is connected to the vertical transmission portion 101.

Figure 12:
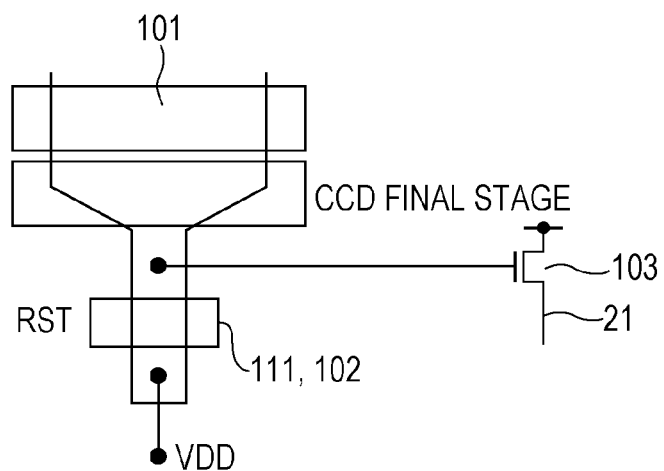
FIG. 12 is an explanatory diagram of an example of the layout at an end part on the charge transmission side of a vertical transmission portion of FIG. 11.

FIG. 12 is an explanatory diagram of an example of the layout at the end part in the charge transmission direction of the vertical transmission portion 101.

In FIG. 12, the vertical transmission portion 101 is shown to extend in the vertical direction.

A gate electrode 111 of a reset transistor 36 is formed to intersect with the lower end edge of the vertical transmission portion 101.

In addition, a part between the final stage of the vertical transmission portion 101 and the gate electrode 111 of the reset transistor 36 is connected to the gate of an amplification transistor 34.

Due to such a structure, the amplification transistor 34 can amplify and output the charge transmitted from the vertical transmission portion 101.

In addition, the vertical transmission portion 101 can be reset to the power-supply voltage by the reset transistor 36.

The column output signal line 21 of FIG. 11 includes a micropad 52 of the first semiconductor substrate 51 and a micropad 54 of a second semiconductor substrate 53 of a signal processing chip 7, and is connected by a microbump 55.

The current supply 37 has a current supply transistor 38 formed in the second semiconductor substrate 53.

The current supply transistor 38 is, for example, an MOS transistor.

In the current supply transistor 38, the source is connected to the column output signal line 21 of the signal processing chip 7, the drain is connected to the ground, and the gate is connected to a bias supply (not shown).

In this manner, the amplification transistor 34 constitutes a source follower circuit using the current supply transistor 38 as a load.

The amplifier 104 is connected to the column output signal line 21 and the horizontal transmission signal line 105 in the second semiconductor substrate 53. The voltage input from the column output signal line 21 is amplified and output to the horizontal transmission signal line 105.

The AD converter 106 is connected to the horizontal transmission signal line 105 in the second semiconductor substrate 53. The AD converter 106 converts the voltage input from the horizontal transmission signal line 105 into a digital value.

The output buffer 107 is connected to the AD converter 106 in the second semiconductor substrate 53. The output buffer 107 outputs an output signal of the AD converter 106 to the outside of the solid-state imaging apparatus 1.

In addition, in the solid-state imaging apparatus 1 of FIG. 11, the reset transistor 102 resets the plurality of photodiodes 31 and the vertical transmission portion 101.

After the reset, the plurality of photodiodes 31 subject incident light to photoelectric conversion.

The vertical transmission portion 101 transmits a charge generated by the photoelectric conversion in the plurality of photodiodes 31 of each column.

The amplification transistor 103 outputs to the column output signal line 21 a pixel signal of a voltage according to the charge generated by each photodiode 31, which is transmitted by the vertical transmission portion 101.

The amplifier 104 amplifies and outputs the pixel signal to the horizontal transmission signal line 105.

The AD converter 106 converts the pixel signal into a digital value.

The output buffer 107 outputs the pixel signal converted into the digital value.

Also in the case of this fourth embodiment, the current supply 37 of the analog circuit is provided in the signal processing chip 7. That is, in this embodiment, distribution is not carried out for each circuit block, but a part of the analog circuit is distributed into the sensor chip 6, and the remaining part of the analog circuit and the digital circuit are distributed into the signal processing chip 7.

In the fourth embodiment, the current supply 37 of the analog circuit is provided in the signal processing chip 7 as in the first embodiment.

In addition, as in the third embodiment, a voltage supply circuit 91 which is connected to the drain of the amplification transistor 34 of the sensor chip 6 may be provided in the signal processing chip 7.

In the CCD sensor-type solid-state imaging apparatus 1 of the fourth embodiment, the circuits from the reset transistor 102 to the horizontal transmission signal line 105 are connected between the plurality of vertical transmission portion 101 and the AD converter 106.

In addition, for example, as in a general CCD sensor-type solid-state imaging apparatus 1, the present disclosure can be applied even when a horizontal transmission portion is provided between the plurality of vertical transmission portions 101 and the AD converter 106.

In this case, for example, the plurality of vertical transmission portions 101 may be connected to the horizontal transmission portion by wiring, and in the wiring, the first and second semiconductor substrates 51 and 53 may be connected to each other.

5. Fifth Embodiment

Figure 13:
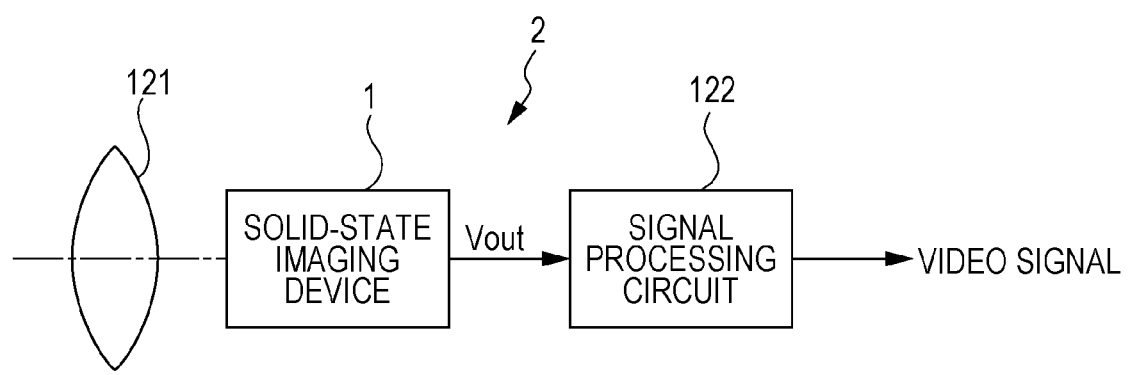
FIG. 13 is a block diagram of an imaging apparatus according to a fifth embodiment of the present disclosure.

FIG. 13 is a block diagram of an imaging apparatus 2 according to a fifth embodiment of the present disclosure.

The imaging apparatus 2 of FIG. 13 has an optical system 121, a solid-state imaging apparatus 1, and a signal processing circuit 122.

The imaging apparatus 2 of FIG. 13 is, for example, a video camera, a digital still camera, a camera for electronic endoscope, or the like.

The optical system 121 makes the solid-state imaging apparatus 1 form the image of image light (incident light) from a subject.

In this manner, in a photodiode 31 of the solid-state imaging apparatus 1, the incident light is converted into a signal charge according to the intensity of the incident light and a charge is generated in the photodiode 31.

The solid-state imaging apparatus 1 is, for example, the solid state imaging apparatus 1 according to the first embodiment. The solid-state imaging apparatus 1 may also be the solid-state imaging apparatus 1 according to the second to fourth embodiment.

The solid-state imaging apparatus 1 outputs an imaging signal based on the charges which are generated in the plurality of photodiodes 31. The imaging signal includes digital values of the pixels corresponding to the charges which are generated in the plurality of photodiodes 31.

The signal processing circuit 122 is connected to the solid-state imaging apparatus 1.

The signal processing circuit 122 subjects the imaging signal output from the solid-state imaging apparatus 1 to various signal processes, and generates and outputs a video signal.

The above-described embodiments are examples of the preferred embodiments of the present disclosure. However, the present disclosure is not limited thereto. Various deformations or modifications may occur without departing from the gist of the present disclosure.

For example, in the above-described embodiments, each column output signal line 21 to which the plurality of pixel circuits 19 are connected is connected to the comparator 41 of the column circuit 14.

The signal of a pixel is digitalized by an ADC including this comparator 41 and the counter 42, and is connected to the horizontal scanning signal line 16 via the memory 43. An analog amplifier which amplifies the voltage of a pixel signal may be disposed in place of this ADC and an analog signal may be transmitted via the horizontal scanning signal line 16 to be subjected to digital conversion at the end part thereof.

The imaging apparatus 2 of the above-described fifth embodiment is used as a video camera, a digital still camera, a monitoring camera, a camera for an electronic endoscope, or the like.

In addition, for example, the solid-state imaging apparatus 1 may be used in electronic devices such as a mobile phone, a Personal Data Assistance (PDA), an electronic book, a computer and a portable player.

The above-described embodiments show an example in which the analog and digital circuits of the solid-state imaging apparatus 1 are divided into the two semiconductor substrates 51 and 53.

In addition, as a semiconductor integrated circuit having analog and digital circuits mounted thereon, there are an integrated circuit for voice which digitalizes and processes a voice and various control sensor integrated circuits which detect and process physical quantities such as temperature, concentration, humidity, and weight. In these integrated circuits, for example, a signal charge is accumulated in a capacitor and subjected to charge-voltage conversion to be output.

The present disclosure can also be applied when analog and digital circuits are divided into two semiconductor substrates in these semiconductor integrated circuits.

In addition, these semiconductor integrated circuits can be used in various electronic devices such as an imaging apparatus, a recording device, a measuring device and a tester device.

In the above-described embodiments, the micropad 52 of the sensor chip 6 and the micropad 54 of the signal processing chip 7 are connected to each other by the microbump 55.

In addition, for example, the sensor chip 6 and the signal processing chip 7 may be connected to each other by a bonding wire or the like. The sensor chip 6 and the signal processing chip 7 may be sealed in a state in which each other's micropads 52 and 54 are brought into contact with each other.

In the above-described embodiments, the current supply transistor 38 for each of the plurality of current supplies 37 provided for each column in the pixel array portion 13 is provided in the signal processing chip 7.

In addition, for example, when the analog circuit such as the pixel array portion 13 has a capacitor which removes the DC component of a signal, a diffusion layer in which this capacitor is formed in the signal processing chip 7 may be used.

Figure 14A:
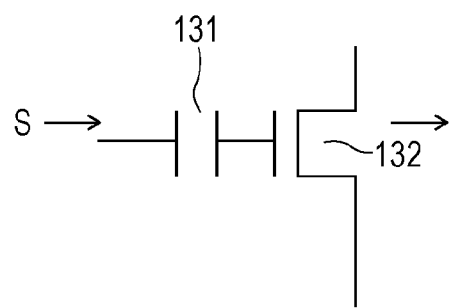
FIGS. 14A and 14B are explanatory diagrams of a DC cutting circuit which removes the DC component of an analog signal.
Figure 14B:
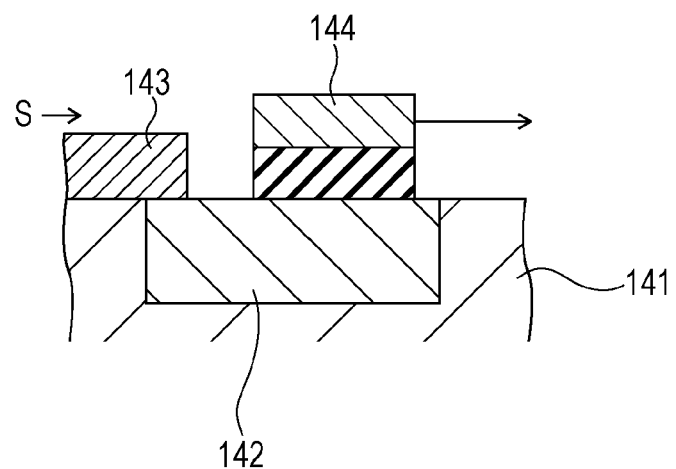

FIGS. 14A and 14B are explanatory diagrams of a DC cutting circuit which removes the DC component of an analog signal.

The DC cutting circuit of FIGS. 14A and 14B has a capacitor 131 which removes the DC component of an analog signal.

In addition, FIGS. 14A and 14B also show a transistor 132 which has a gate to which a signal, the DC component of which is removed by the capacitor 131, is input.

As shown in FIGS. 14A and 14B, this capacitor 131 can be formed using a diffusion layer 142 of a semiconductor substrate 141.

The capacitor 131 of FIGS. 14A and 14B has the diffusion layer 142 which is formed in the semiconductor substrate 141, a first wiring 143 which is connected to one end of the diffusion layer 142, and a second wiring 144 which overlaps with the diffusion layer 142 via an insulating film.

In this manner, when the capacitor 131 which uses the diffusion layer 142 formed in the semiconductor substrate 141 is formed in the signal processing chip, it is not necessary to provide an input protection circuit in the transistor 132 of FIGS. 14A and 14B to which the analog signal is input or the digital circuit.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor integrated circuit comprising:
   first and second substrates;
   a first part of an analog signal circuit on the first substrate, the analog signal circuit generating an analog signal, the first part including at least a transfer transistor, a reset transistor, a select transistor, and an amplification transistor formed as a follower circuit, wherein a drain of the select transistor is connected to a power supply, a source of the select transistor is connected to a drain of the amplification transistor, and a gate of the amplification transistor is connected to a floating diffusion;
   a second part of the analog signal circuit on the second substrate, the second part including a current supply, the current supply being used as a load for the follower circuit;
   a digital signal circuit on the second substrate, the digital signal circuit converting the analog signal into a digital signal; and
   a connection between the first and second substrates electrically connecting the first and second parts of the analog signal circuit.

2. The semiconductor integrated circuit according to claim 1, further comprising:
   a row scanning circuit on the first substrate.

3. The semiconductor integrated circuit according to claim 2, further comprising:
   at least one of a timing control circuit and a scanning circuit on the second substrate, wherein the row scanning circuit overlays the at least one of the timing control circuit and the scanning circuit.

4. The semiconductor integrated circuit according to claim 1, wherein:
   the first substrate further comprises:
      a first transistor that is included in a part of the analog signal circuit, and
      an output terminal that is connected to the first transistor and the connection, and
   the second substrate further comprises:
      an input terminal that is connected to the connection, and
      a diffusion layer that is included in the current supply of the analog signal circuit and is connected to the input terminal.

5. The semiconductor integrated circuit according to claim 4, wherein the diffusion layer is a diffusion layer of a second transistor that is included in the current supply of the analog signal circuit.

6. The semiconductor integrated circuit according to claim 1, wherein:
   the semiconductor integrated circuit further comprises:
      a plurality of pixel circuits, each having a photoelectric conversion element and each outputting a pixel signal,
      an output signal line which is connected to the plurality of pixels and transmits the pixel signal,
      the current supply which is connected to the output signal line, and
      a conversion portion that is connected to the output signal line and converts the pixel signal transmitted by the output signal line into a digital value;
   the plurality of pixel circuits includes the first part of the analog signal circuit in the first semiconductor substrate;
   the conversion portion is formed as the digital circuit in the second semiconductor substrate; and
   the output signal line includes the connection and is formed from the first semiconductor substrate to the second semiconductor substrate.

7. The semiconductor integrated circuit according to claim 6, wherein:
   each pixel circuit formed in the first semiconductor substrate has a first field-effect transistor in which a source node is connected to the output signal line and that functions as the first transistor,
   the current supply formed in the second semiconductor substrate has a second field-effect transistor in which a source node is connected to the output signal line and wherein the source node functions as the second transistor, and
   the first field-effect transistor constitutes a source follower circuit using the second field-effect transistor as a load.

8. The semiconductor integrated circuit according to claim 7, wherein the second semiconductor substrate has a power supply portion that supplies a power-supply voltage to the drain of the first field-effect transistor formed in the first semiconductor substrate.

9. The semiconductor integrated circuit according to claim 8, wherein the second semiconductor substrate overlaps with the first semiconductor substrate so that the second transistor does not overlap with the plurality of pixel circuits of the first semiconductor substrate, and thus it is difficult for the light emitted from the second transistor to enter the plurality of pixel circuits.

10. The semiconductor integrated circuit according to claim 6, wherein:
    the first semiconductor substrate overlaps with the second semiconductor substrate, and
    a light-shielding portion is provided between the second transistor that is formed in the second semiconductor substrate and the plurality of pixel circuits that are formed in the first semiconductor substrate to inhibit the entry of the light emitted from the second transistor to the plurality of pixel circuits.

11. The semiconductor integrated circuit according to claim 1, wherein:
    the semiconductor integrated circuit further comprises:
       a plurality of photoelectric conversion elements that generate a charge,
       a transmission portion that transmits the charge generated by the plurality of photoelectric conversion elements, and
       a conversion portion that converts the charge transmitted by the transmission portion into a digital value;
    the plurality of photoelectric conversion elements are formed as a part of the analog signal circuit in the first semiconductor substrate;
    the conversion portion is formed as the digital circuit in the second semiconductor substrate; and
    the transmission portion includes the connection and is formed from the first semiconductor substrate to the second semiconductor substrate.

12. The semiconductor integrated circuit according to claim 11, wherein:
the transmission portion further comprises:
a first transmission portion which is formed in the first semiconductor substrate, and receives and transmits the charge generated from the plurality of photoelectric conversion elements,
a first field-effect transistor in which a gate is connected to the first transmission portion in the first semiconductor substrate and that functions as the first transistor, and
a second field-effect transistor that functions as a second transistor in the second semiconductor substrate; and
the first field-effect transistor constitutes a source follower circuit using the second field-effect transistor as a load.

13. The semiconductor integrated circuit according to claim 4, wherein the diffusion layer functions as one electrode of a capacitor that removes a DC component of an analog signal input from the input terminal.

14. The semiconductor integrated circuit of claim 13, wherein the analog signal circuit comprises photoelectric converters and circuitry to generate the analog signal in accordance with light incident on the first substrate.

15. The semiconductor integrated circuit of claim 14, wherein the second part of the analog signal circuit on the second substrate includes a portion of a column output signal line and a power supply connected to the portion of the column output signal line.

16. The semiconductor integrated circuit of claim 14, wherein the row scanning circuit selects a plurality of row selection signal lines based on a vertical synchronization signal input from the timing control circuit.

17. An imaging apparatus, comprising:
first and second substrates;
photoelectric conversion elements on the first substrate;
a first part of an analog signal circuit on the first substrate, the analog signal circuit generating an analog signal, the first part including at least a transfer transistor, a reset transistor, a select transistor, and an amplification transistor formed as a follower circuit, wherein a drain of the select transistor is connected to a power supply, a source of the select transistor is connected to a drain of the amplification transistor, and a gate of the amplification transistor is connected to a floating diffusion;
a second part of the analog signal circuit on the second substrate, the second part including a current supply, the current supply being used as a load for the follower circuit;
a digital signal circuit on the second substrate, the digital signal circuit converting the analog signal into a digital signal; and
a connection between the first and second substrates electrically connecting the first and second parts of the analog signal circuit.

18. The imaging apparatus according to claim 17, further comprising:
a row scanning circuit on the first substrate.

19. The imaging apparatus according to claim 18, further comprising:
at least one of a timing control circuit and a scanning circuit on the second substrate, wherein the row scanning circuit overlays the at least one of the timing control circuit and the scanning circuit.

20. The imaging apparatus according to claim 17, wherein:
the first substrate further comprises:
a first transistor that is included in a part of the analog signal circuit, and
an output terminal that is connected to the first transistor and the connection, and
the second substrate further comprises:
an input terminal that is connected to the connection, and
a diffusion layer that is included in the current supply of the analog signal circuit and is connected to the input terminal.

* * * * *